(12) United States Patent
Liang et al.

(10) Patent No.: US 12,224,221 B2
(45) Date of Patent: Feb. 11, 2025

(54) PACKAGING METHOD AND PACKAGE STRUCTURE

(71) Applicant: HARVATEK CORPORATION, Hsinchu (TW)

(72) Inventors: Chin-Jui Liang, Hsinchu (TW); Hui-Yen Huang, Hsinchu (TW); Ping-Lung Wang, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 436 days.

(21) Appl. No.: 17/863,400

(22) Filed: Jul. 13, 2022

(65) Prior Publication Data
US 2023/0343666 A1 Oct. 26, 2023

(30) Foreign Application Priority Data

Apr. 22, 2022 (TW) .................................. 111115358

(51) Int. Cl.
*H01L 29/66* (2006.01)
*H01L 21/56* (2006.01)
(Continued)

(52) U.S. Cl.
CPC ........ *H01L 23/3135* (2013.01); *H01L 21/566* (2013.01); *H01L 24/08* (2013.01);
(Continued)

(58) Field of Classification Search
CPC ... H01L 23/3135; H01L 21/566; H01L 24/32; H01L 24/80; H01L 25/0655; H01L 2224/08238; H01L 2224/08258; H01L 2224/73251; H01L 2224/80006; H01L 2224/80097; H01L 2224/80895;
(Continued)

(56) References Cited

U.S. PATENT DOCUMENTS 5,394,303 A * 2/1995 Yamaji ................ H01L 23/3107
174/557
8,173,488 B2 * 5/2012 Bauer .................... H01L 21/561
438/118
(Continued)

FOREIGN PATENT DOCUMENTS

TW 202141697 A 11/2021
TW 202145463 A 12/2021

*Primary Examiner* — Niki H Nguyen
(74) *Attorney, Agent, or Firm* — Li & Cai Intellectual Property Office

(57) ABSTRACT

A packaging method and a package structure are provided. The packaging method includes the following steps. Firstly, a plurality of chips are disposed on a carrying surface of a carrying board for chip redistribution. Each of the chips includes a first side connected to the carrying surface and a second side opposite to the first side, and the second side is provided with at least one chip connecting member. Next, a base structure is provided. The base structure has a bonding surface provided with a plurality of predetermined areas for bonding the chips respectively, and each of the predetermined regions has at least one electrically connecting structure formed therein. Lastly, an encapsulating material is applied to integrate the base structure, the chips, and the carrying board into a unitary structure under specific hot pressing conditions.

10 Claims, 8 Drawing Sheets

(51) Int. Cl.
   *H01L 23/00*   (2006.01)
   *H01L 23/31*   (2006.01)
   *H01L 25/065*   (2023.01)
(52) U.S. Cl.
   CPC .............. *H01L 24/32* (2013.01); *H01L 24/73* (2013.01); *H01L 24/80* (2013.01); *H01L 25/0655* (2013.01); *H01L 2224/08238* (2013.01); *H01L 2224/08258* (2013.01); *H01L 2224/32221* (2013.01); *H01L 2224/73251* (2013.01); *H01L 2224/80006* (2013.01); *H01L 2224/8009* (2013.01); *H01L 2224/80091* (2013.01); *H01L 2224/80097* (2013.01); *H01L 2224/80203* (2013.01); *H01L 2224/80895* (2013.01); *H01L 2924/182* (2013.01); *H01L 2924/37001* (2013.01)
(58) Field of Classification Search
   CPC ..... H01L 2924/182; H01L 2924/37001; H01L 24/97; H01L 2224/32225; H01L 2224/48247; H01L 2224/04105; H01L 2224/16225; H01L 2224/73204; H01L 23/3128; H01L 25/0753; H01L 2224/48465; H01L 24/83; H01L 21/56; H01L 23/3107; H01L 2224/32145; H01L 21/486; H01L 2924/0665; H01L 2225/06586; H01L 33/52; H01L 23/28; H01L 2225/06506; H01L 33/06; H01L 33/18; H01L 2224/73265; H01L 2224/24145; H01L 24/82; H01L 2924/12041; H01L 2221/6835; H01L 2224/06051; H01L 2224/0401; H01L 21/563; H01L 2224/16227; H01L 2224/48228; H01L 2224/80203; H01L 2924/15311; H01L 2924/3025
   See application file for complete search history.

(56) References Cited

U.S. PATENT DOCUMENTS

| | | | |
|---|---|---|---|
| 2008/0074029 A1* | 3/2008 | Suehiro | H01L 24/97 257/E33.059 |
| 2016/0276174 A1 | 9/2016 | Kim et al. | |
| 2020/0203296 A1* | 6/2020 | Chew | H01L 24/24 |
| 2021/0118844 A1* | 4/2021 | Wu | H01L 25/0655 |
| 2021/0232744 A1 | 7/2021 | Lin et al. | |
| 2022/0069489 A1 | 3/2022 | Lau et al. | |
| 2022/0102254 A1* | 3/2022 | Chew | H01L 21/561 |
| 2022/0108974 A1 | 4/2022 | Scharf et al. | |

* cited by examiner

PACKAGING METHOD AND PACKAGE STRUCTURE

CROSS-REFERENCE TO RELATED PATENT APPLICATION

This application claims the benefit of priority to Taiwan Patent Application No. 111115358, filed on Apr. 22, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure belongs to the semiconductor manufacturing field, and more particularly relates to a packaging method and a package structure.

BACKGROUND OF THE DISCLOSURE

With the vigorous development of the electronic industry, electronic products continue to develop toward a lightweight, compact, and functional design. Thus, different packaging techniques have been developed, in which panel-level package (PLP) has received wide attention due to having the advantages of high production efficiency, low production costs, and better suited for mass production, furthermore, PLP also has greater diversity in marketing application.

The panel-level package is a process including the steps of cutting a wafer into a plurality of dies, arranging the dies onto a carrier, and simultaneously packaging the dies in the same process step. However, the panel-level package requires complicated steps and incurs higher costs. Therefore, the related industry attempts to simplify process steps and reduce the production costs in various ways based on general process capabilities.

SUMMARY OF THE DISCLOSURE

In response to the above-referenced technical inadequacies, the present disclosure provides a packaging method, which can complete the bonding and packaging of semiconductor chips in the same process step, and a package structure obtained by utilizing the packaging method.

In one aspect, the present disclosure provides a packaging method, which includes: providing a carrying board having a carrying surface; disposing a plurality of chips on the carrying surface of the carrying board; and providing a base structure and integrating the base structure, the chips, and the carrying board into a unitary structure under hot pressing conditions via an encapsulating material. Each of the chips includes a first side connected to the carrying surface and a second side opposite to the first side, and the second side is provided with at least one chip connecting member. The base structure has a bonding surface provided with a plurality of predetermined regions for bonding the chips respectively, and each of the predetermined regions has at least one electrically connecting structure formed therein. The at least one chip connecting member of each of the chips and the at least one electrically connecting structure in the corresponding one of the predetermined regions have a metal-to-metal bond formed therebetween and under the hot pressing conditions. The encapsulating material is formed into an encapsulating layer under the hot pressing conditions, and the encapsulating layer is located between the carrying board and the base structure to isolate the chips from the external environment.

In another aspect, the present disclosure provides a package structure, which includes a carrying board, a plurality of chips, a base structure, and an encapsulating layer. The carrying board has a carrying surface, and the chips are disposed on the carrying surface of the carrying board. Each of the chips includes a first side connected to the carrying surface and a second side opposite to the first side, and the second side is provided with at least one chip connecting member. The base structure has a bonding surface provided with a plurality of predetermined regions for bonding the chips respectively. Each of the predetermined regions has at least one electrically connecting structure formed therein. The encapsulating layer is located between the carrying board and the base structure to isolate the chips from the external environment. The at least one chip connecting member of each of the chips and the at least one electrically connecting structure in the corresponding one of the predetermined regions have a metal-to-metal bond formed therebetween, and the metal-to-metal bond and the encapsulating layer are both formed under hot pressing conditions.

In certain embodiments, the hot pressing conditions include a vacuum degree, a predetermined pressure, a predetermined temperature, and a predetermined time period. The vacuum degree is from $10^{-5}$ Torr to $10^{-1}$ Torr, the predetermined pressure is from 1 MPa to 100 MPa, the predetermined temperature is from 25° C. to 280° C., and the predetermined time period is from 1 second to 600 seconds.

In certain embodiments, the metal-to-metal bond is a copper-to-copper direct bond, a silver-to-silver direct bond, a gold-to-tin eutectic bond, a gold-to-silver eutectic bond, a palladium-to-tin eutectic bond, a palladium-to-silver eutectic bond, or a palladium-to-copper eutectic bond.

In certain embodiments, the packaging method further includes: removing the carrying board and disposing a functional layer on the chips.

In certain embodiments, the functional layer is a heat dissipating layer.

In certain embodiments, in the step of disposing the chips on the carrying surface of the carrying board, each of the chips is fixed to the carrying surface of the carrying board by an adhesive material.

In certain embodiments, the second side of each of the chips is further provided with a plurality of contact pads and a redistribution structure formed on the contact pads, and the at least one chip connecting member is formed on the redistribution structure and in electrical contact with the contact pads.

In certain embodiments, the base structure is a circuit board, a lead frame, or a package substrate.

Therefore, by virtue of providing a base structure and integrating the base structure, the chips, and the carrying board into a unitary structure under hot pressing conditions via an encapsulating material and by virtue of a metal-to-metal bond being formed between the at least one chip connecting member of each of the chips and the at least one electrically connecting structure in the corresponding one of the predetermined regions, and both of the metal-to-metal bond and the encapsulating layer being formed under the hot pressing conditions, the packaging method can achieve the beneficial effects of reducing process steps, shortening process time, miniaturizing a package size, and increasing a package yield and reliability, thereby meeting the requirements of high-end products and high performance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
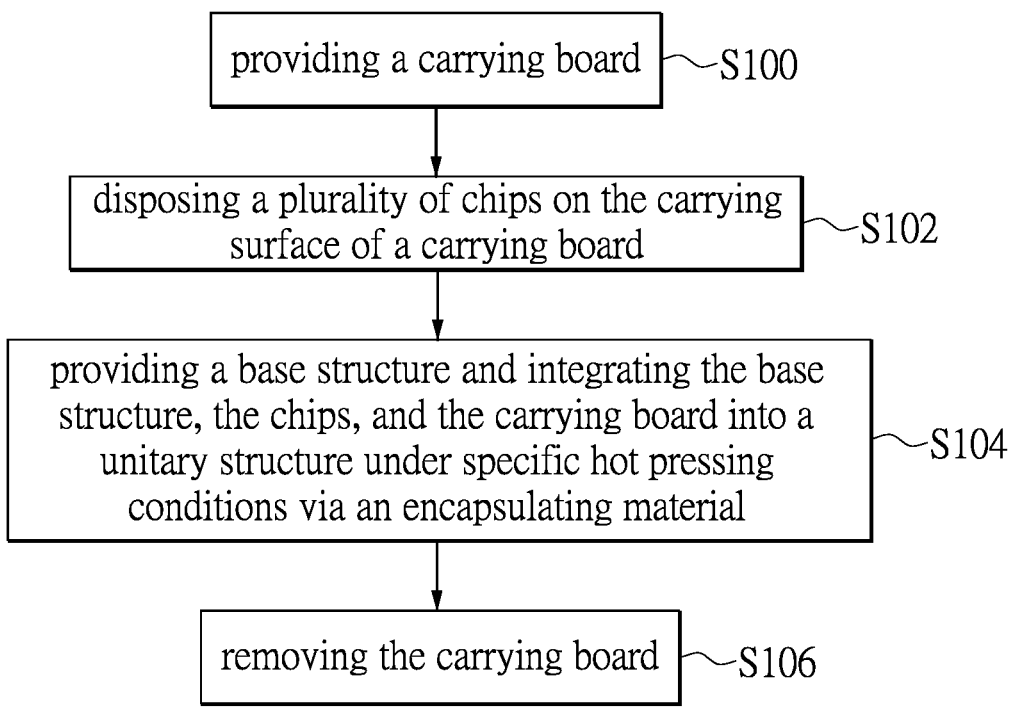
FIG. 1 is a flowchart of a packaging method according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Unless otherwise stated, the material(s) used in any described embodiment is/are commercially available material(s) or may be prepared by methods known in the art, and the equipment or operation(s) used in any described embodiment is/are conventional equipment or operation(s) generally known in the related art.

Although any steps shown in a flowchart are described herein in a specific order, the steps are not required or implied to be executed in the specific order or all executed to achieve desired results. In execution, it is optional to combine two or more steps into one step, or to divide one step into two or more steps.

First Embodiment

Referring to FIG. 1, a first embodiment of the present disclosure provides a packaging method, which includes: step S100, providing a carrying board; step S102, disposing a plurality of chips on a carrying surface of the carrying board; and S104, providing a base structure and having an encapsulating material to integrate the base structure, the chips, and the carrying board into a unitary structure under hot pressing conditions. It is worth mentioning that compared to conventional packaging techniques, the packaging method of the present disclosure can provide significant advantages in reducing process steps, shortening process time, miniaturizing a package size, and increasing a package yield and reliability. The following will describe the implementation details of each of steps S100 to S106 with reference to FIG. 2 to FIG. 6, correspondingly.

Figure 2:
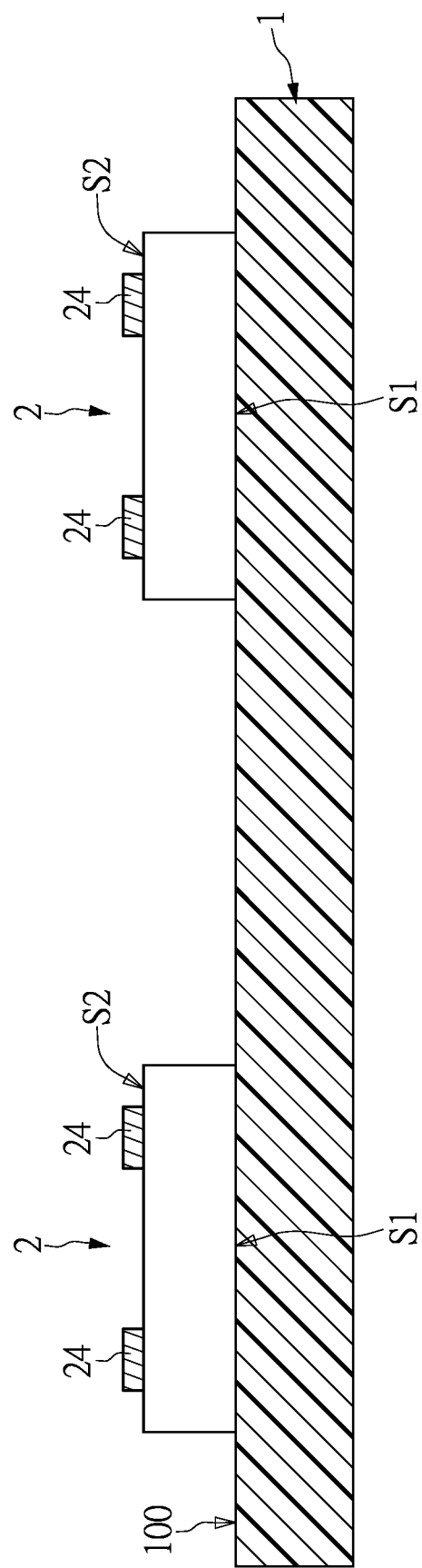
FIG. 2 and FIG. 3 are schematic views showing step S100 and step S102 of the packaging method according to the first embodiment of the present disclosure.

Step S100 is a preparatory step for step S102. As shown in FIG. 2, the carrying board 1 provided in step S100 can be a rigid carrying board or a flexible carrying board, and preferably a rigid carrying board. The carrying board 1 can have any desired shape (e.g., a rectangle) and size, and has a carrying surface 100 such as a flat surface. It should be noted that, if the carrying board 1 has a larger size, a greater quantity of chips can be arranged on the carrying board 1 for packaging and integration, which is beneficial to reduce packaging costs. In the present embodiment, the carrying board 1 may have no electrical functions and is specifically exemplified by a BT (Bismaleimide Triazine) board, an ABF (Ajinomoto Build-up Film) board, a glass board, a plastic board, or a circuit board. However, such examples are not intended to limit the present disclosure. In practice, other suitable materials can be used for the carrying board 1, as long as they can provide desired load-carrying ability and ability to withstand the effects of subsequent processes (i.e., to ensure the operability of the subsequent processes).

Step S102 is a chip redistribution step. As shown in FIG. 2, in step S102, the chips 2 are redistributed on the carrying surface 100 of the carrying board 1 at predetermined positions and in a predetermined posture, in which each of the chips 2 includes a first side S1 connected to the carrying surface 100 and a second side S2 opposite to the first side S1. The second side S2 can be a side where an active surface of the chip 2 is located, and it is provided with at least one chip connecting member 24 (e.g., at least one metal bump) to establish an electrical connection between the chip 2 and other components. In the present embodiment, the chips 2 can be semiconductor chips produced from a wafer, and various circuits can be formed on the bodies of the chips 2. In the present embodiment, the chips 2 can have the same or different types of functions, and can include processing chips, logic chips, storage chips and/or communication chips. However, such examples are not intended to limit the present disclosure.

Figure 3:
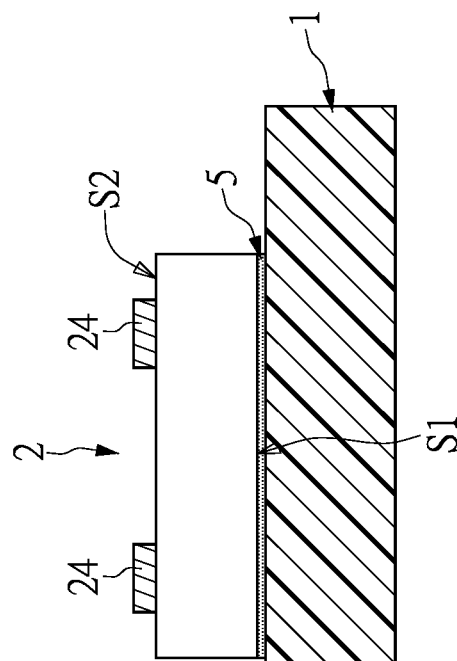
Figure 3:
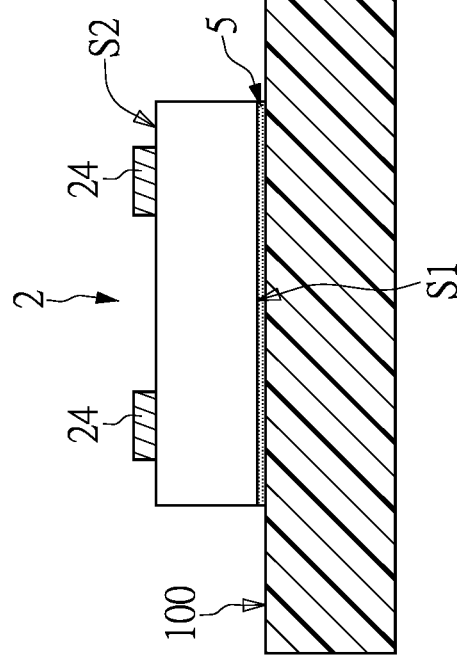

In practice, as shown in FIG. 3, each of the chips 2 can be fixed to the carrying surface 100 of the carrying board 1 by an adhesive material 5. The adhesive material 5 can be a die attach film (DAF), but it is not limited thereto. In certain embodiments, the adhesive material 5 can be a thermal-release adhesive film, so as to easily separate the carrying board 1 from the chips 2 after packaging.

Figure 4:
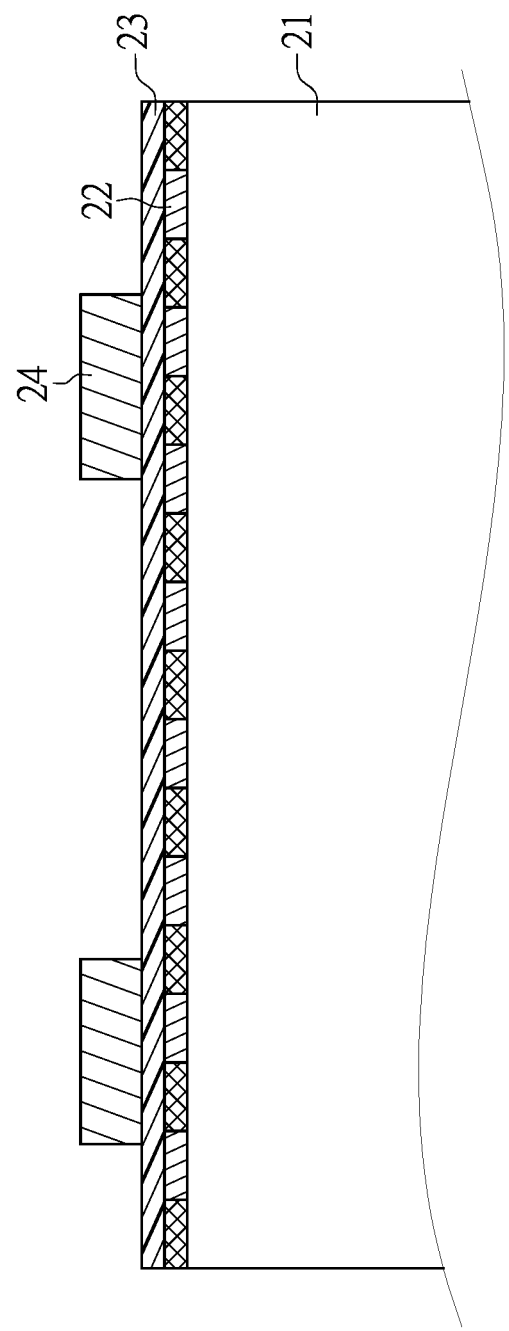
FIG. 4 is a schematic view of a chip used in the packaging method according to the first embodiment of the present disclosure.

Depending on particular requirements, as shown in FIG. 4, the second side S2 of each of the chips 2 can be further provided with contact pads 22 and a redistribution structure 23, and the at least one chip connecting member 24 can be electrically connected to the contact pads 22 through the redistribution structure 23. More specifically, the contact pads 22 are formed on a chip body 21 (e.g., a body of silicon, germanium, or gallium arsenide), and the at least one chip connecting member 24 is formed on the redistribution structure 23. It should be noted that, the redistribution structure 23 can have different configurations of conductive paths according to different design requirements, and the present disclosure has no particular limitations on the redistribution structure 23.

Figure 5:
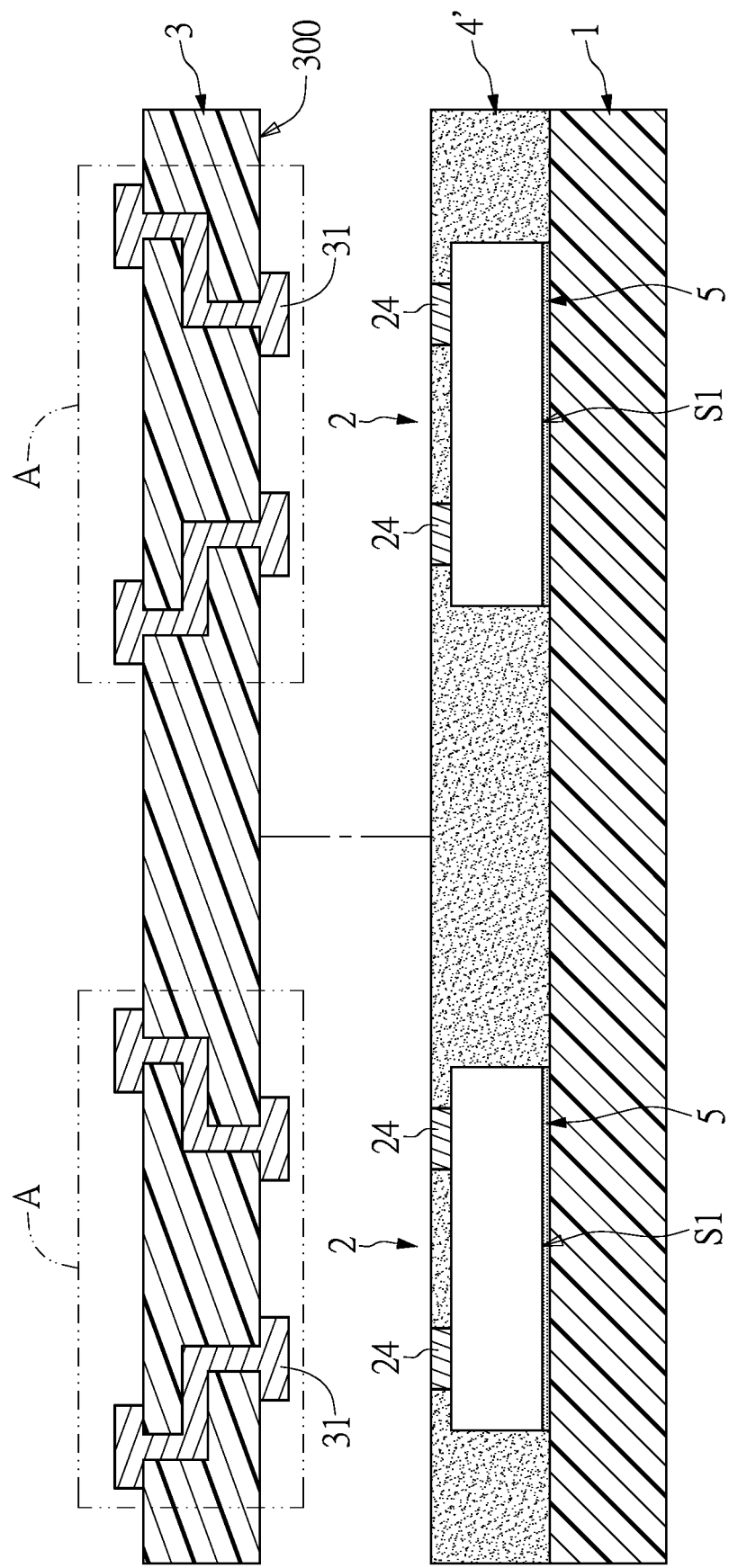
FIG. 5 and FIG. 6 are schematic views showing step S104 of the packaging method according to the first embodiment of the present disclosure.
Figure 6:
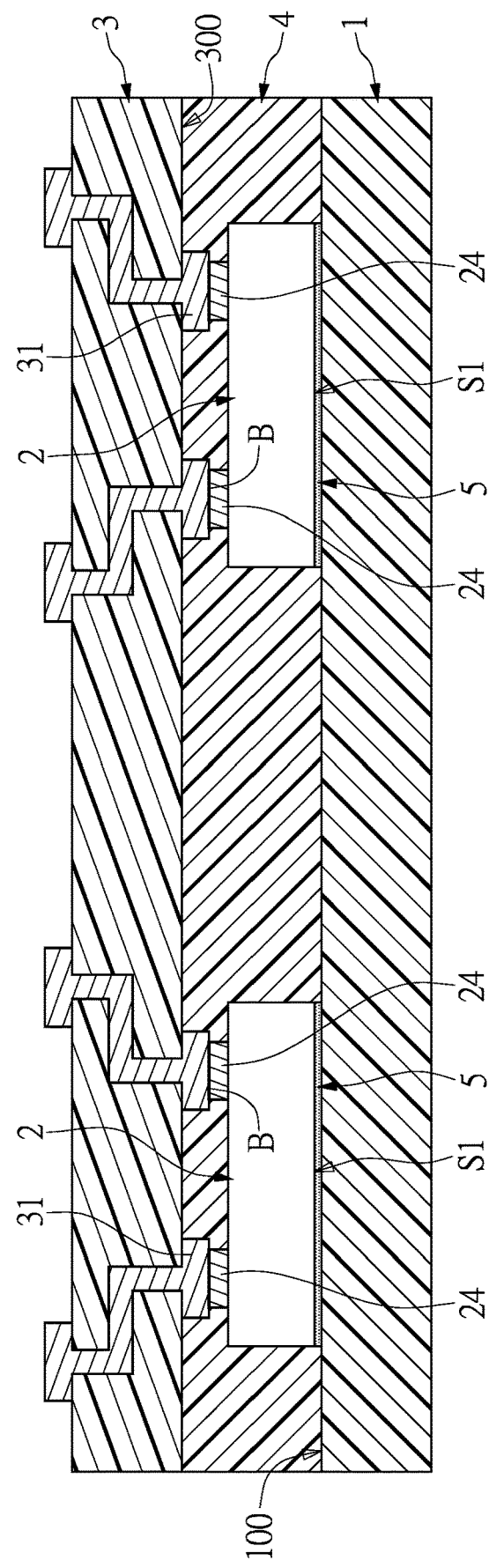

Step S104 is a chip bonding and packaging step. In step S104, as shown in FIG. 5 and FIG. 6, an encapsulating material 4' is applied to the carrying surface 100 of the carrying board 1 in the beginning by any means including, but not limited to, coating and attaching, so as to at least encapsulate a portion of each the chips 2. Afterwards, the chips 2 are aligned with and hot-pressed to a plurality of predetermined regions A (e.g., chip arrangement regions) of the base structure 3. Under specific hot pressing conditions, the chips 2 can be respectively bonded to the predetermined regions A of the base structure 3, and the encapsulating material 4' can be formed into an encapsulating layer 4 located between the carrying board 1 and the base structure 3 to isolate the chips 2 from the external environment, thereby reducing negative effects caused by environmental factors (e.g., moisture) and preventing the chips 2 from being physically damaged. In the present disclosure, the encapsulating material 4' can be a molding compound or a dry film. The base structure 3 can be a circuit board, a lead frame, or a package substrate. However, such examples are not intended to limit the present disclosure. The base structure 3 has a bonding surface 300 provided with a plurality of predetermined regions A, and each of the predetermined regions A has at least one electrically connecting structure 31 (e.g., electrically connecting pads or pins) formed therein.

In certain embodiments, the encapsulating material 4' can be applied to the bonding surface 300 of the base structure 3, and the carrying board 1 that has the chips 2 attached thereon and the base structure 3 are then hot-pressed to each other.

More specifically, the hot pressing conditions used for step S104 include a vacuum degree, a predetermined pressure, a predetermined temperature, and a predetermined time period. The vacuum degree is from $1^{-5}$ Torr to $10^{-1}$ Torr, and preferably less than $10^{-3}$ Torr. The predetermined pressure is from 1 MPa to 100 MPa, and preferably from 20 MPa to 80 MPa. The predetermined temperature is from 25° C. to 280° C., and preferably from 200° C. to 250° C. The predetermined time period is from 1 second to 600 seconds, and preferably from 1 second to 300 seconds.

It is worth mentioning that, in the hot pressing process, the encapsulating material 4' becomes softened to totally fill gaps between the carrying board 1, the chips 2, and the base structure 3 and to cover the chips 2, and is then completely cured to form the encapsulating layer 4. Furthermore, the at least one chip connecting member 24 of each of the chips 2 and the at least one electrically connecting structure 31 in the corresponding one of the predetermined regions A have a metal-to-metal bond B formed therebetween. Preferably, the metal-to-metal bond B is a copper-to-copper (Cu—Cu) direct bond, a silver-to-silver (Ag—Ag) direct bond, a gold-to-tin (Au—Sn) eutectic bond, a gold-to-silver (Au—Ag) eutectic bond, a palladium-to-tin (Pd—Sn) eutectic bond, a palladium-to-silver (Pd—Ag) eutectic bond, or a palladium-to-copper (Pd—Cu) eutectic bond. However, such examples are not intended to limit the present disclosure. In practice, other suitable metal-to-metal bonds B can be formed, as long as they can provide a desired bonding force and establish good conductive connection.

Figure 7:
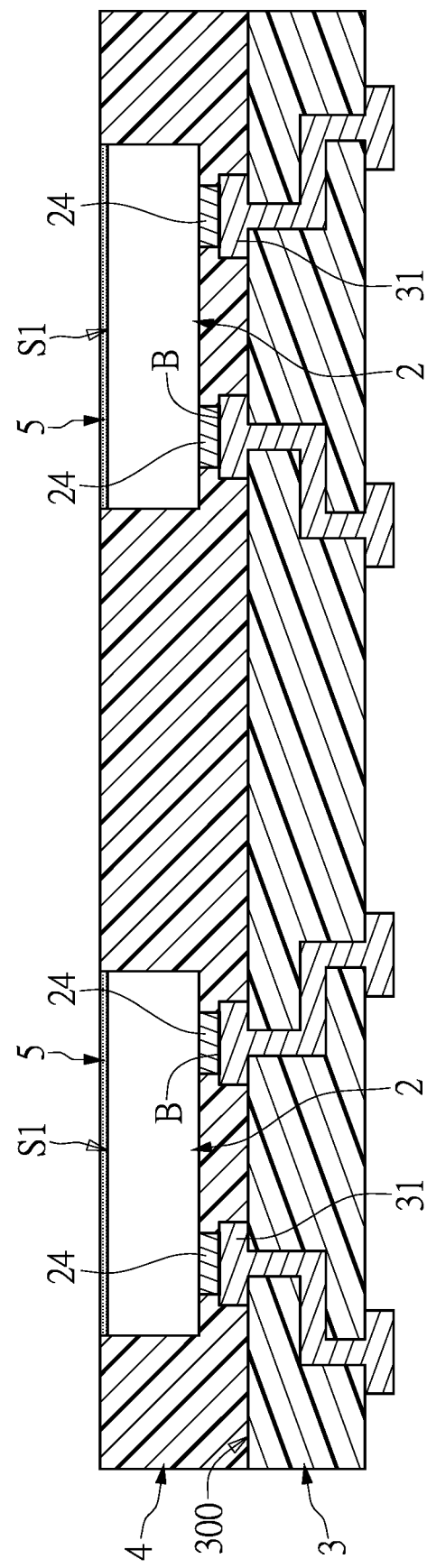
FIG. 7 is a schematic view showing step S106 of the packaging method according to the first embodiment of the present disclosure.
Figure 8:
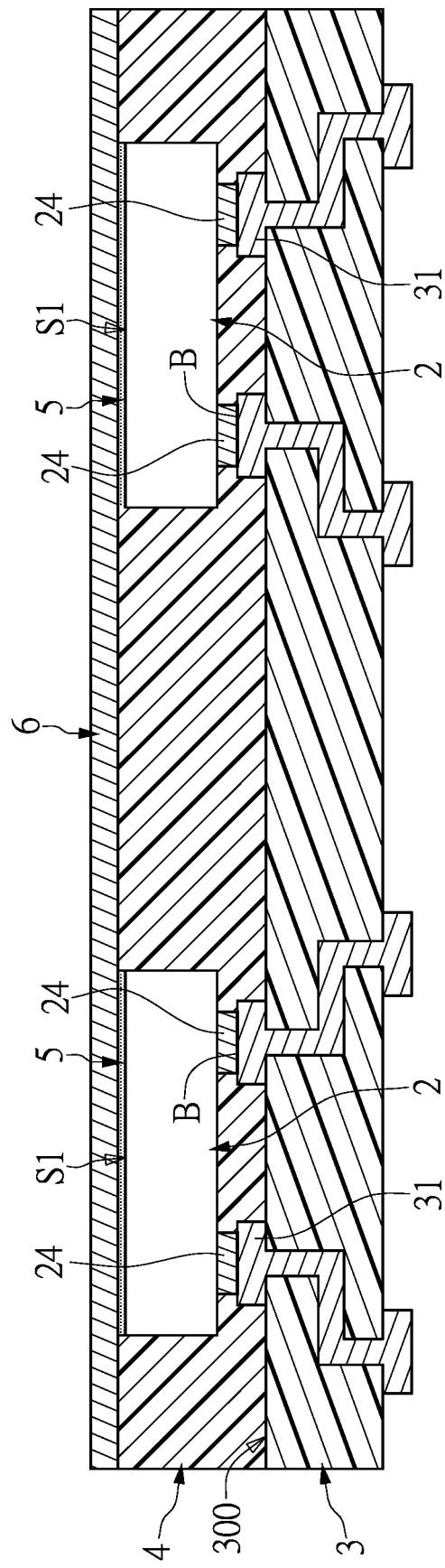
FIG. 8 is a schematic view showing an optional step after step S106 of the packaging method according to the first embodiment of the present disclosure.

Referring to FIG. 1, which is to be read in conjunction with FIG. 7 and FIG. 8, the packaging method of the present disclosure can further include a step of removing the carrying board and disposing a functional layer on the chips (step S106). In practice, the carrying board 1 being removed can be an ABF board, and a functional layer 6 can be a heat dissipating layer and covers the chips 2 and the encapsulating layer 4. Therefore, heat generated by the chips 2 can be quickly dissipated to the outside through the functional layer 6, thereby extending the lifespan of the electronic devices.

Second Embodiment

Referring to FIG. 5 to FIG. 6, a second embodiment of the present disclosure provides a package structure that is obtained by the packaging method mentioned in the first embodiment. The package structure includes a carrying board 1, a plurality of chips 2, a base structure 3, and an encapsulating layer 4. The carrying board 1 has a carrying surface 100, and the chips 2 are disposed on the carrying surface 100 of the carrying board 1. Each of the chips 2 includes a first side S1 connected to the carrying surface 100 and a second side S2 opposite to the first side S1, and the second side S2 is provided with at least one chip connecting member 24. The base structure 3 has a bonding surface 300 provided with a plurality of predetermined regions A for bonding the chips 2 respectively. Each of the predetermined regions A has at least one electrically connecting structure 31 formed therein. The encapsulating layer 4 is located between the carrying board 1 and the base structure 3 to isolate the chips 2 from the external environment. The at least one chip connecting member 24 of each of the chips 2 and the at least one electrically connecting structure 31 in the corresponding one of the predetermined regions A have a metal-to-metal bond B formed therebetween, and the metal-to-metal bond B and the encapsulating layer 4 are both formed under specific hot pressing conditions.

In the present embodiment, the hot pressing conditions used for step S104 include a vacuum degree, a predetermined pressure, a predetermined temperature, and a predetermined time period. The vacuum degree is from $10^{-5}$ Torr to $10^{-1}$ Torr, and preferably less than $10^{-3}$ Torr. The predetermined pressure is from 1 MPa to 100 MPa, and preferably from 20 MPa to 80 MPa. The predetermined temperature is from 25° C. to 280° C., and preferably from 200° C. to 250° C. The predetermined time period is from 1 second to 600 seconds, and preferably from 1 second to 300 seconds.

In practice, the carrying board 1 may have no electrical functions and is specifically exemplified by a BT (Bismaleimide Triazine) board, an ABF (Ajinomoto Build-up Film)

board, a glass board, a plastic board, or a circuit board. The chips 2 can include processing chips, logic chips, storage chips and/or communication chips, and each of the chips 2 can be fixed to the carrying surface 100 of the carrying board 1 by an adhesive material 5. The adhesive material 5 can be a die attach film (DAF). The base structure 3 can be a circuit board, a lead frame, or a package substrate. The encapsulating layer 4 can be formed from a molding compound or a dry film. However, such examples are not intended to limit the present disclosure.

In certain embodiments, as shown in FIG. 8, the carrying board 1 of the packaging structure can be replaced with a functional layer 6. The functional layer 6 can be a heat dissipating layer that covers the chips 2 and the encapsulating layer 4, thereby addressing the heat dissipation problems of the packaging structure.

The relevant technical details mentioned in the first embodiment are still valid in the present embodiment and will not be repeated herein for the sake of brevity. Similarly, the technical details mentioned in the present embodiment can also be applied in the first embodiment.

Beneficial Effects of the Embodiments

In conclusion, by virtue of providing a base structure and having an encapsulating material to integrate the base structure, the chips, and the carrying board into a unitary structure under hot pressing conditions and by virtue of a metal-to-metal bond being formed between the at least one chip connecting member of each of the chips and the at least one electrically connecting structure in the corresponding one of the predetermined regions, and both of the metal-to-metal bond and the encapsulating layer being formed under the hot pressing conditions, the packaging method can achieve the beneficial effects of reducing process steps, shortening process time, miniaturizing a package size, and increasing a package yield and reliability, thereby meeting the requirements of high-end products and high performance. Furthermore, the packaging method can reduce a package size to 0.1 mm to 0.35 mm.

In order to increase production efficiency, the packaging method can be implemented by a roll-to-roll pressing apparatus, such that a carrying board having a plurality of chips disposed thereon and a base structure can be continuously hot-pressed to each other via an encapsulating material so as to form a unitary structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A packaging method, comprising:
providing a carrying board having a carrying surface;
disposing a plurality of chips on the carrying surface of the carrying board, wherein each of the chips includes a first side connected to the carrying surface and a second side opposite to the first side, and the second side is provided with at least one chip connecting member; and
providing a base structure and integrating the base structure, the chips, and the carrying board into a unitary structure under hot pressing conditions via an encapsulating material;
wherein the base structure has a bonding surface provided with a plurality of predetermined regions for bonding the chips respectively, and each of the predetermined regions has at least one electrically connecting structure formed therein;
wherein the at least one chip connecting member of each of the chips and the at least one electrically connecting structure in the corresponding one of the predetermined regions have a metal-to-metal bond formed therebetween and under the hot pressing conditions, the encapsulating material is formed into an encapsulating layer under the hot pressing conditions, and the encapsulating layer is located between the carrying board and the base structure to isolate the chips from the external environment.

2. The packaging method according to claim 1, wherein the hot pressing conditions include a vacuum degree, a predetermined pressure, a predetermined temperature, and a predetermined time period, the vacuum degree is from $10^{-5}$ Torr to $10^{-1}$ Torr, the predetermined pressure is from 1 MPa to 100 MPa, the predetermined temperature is from 25° C. to 280° C., and the predetermined time period is from 1 second to 600 seconds.

3. The packaging method according to claim 1, wherein the metal-to-metal bond is a copper-to-copper direct bond, a silver-to-silver direct bond, a gold-to-tin eutectic bond, a gold-to-silver eutectic bond, a palladium-to-tin eutectic bond, a palladium-to-silver eutectic bond, or a palladium-to-copper eutectic bond.

4. The packaging method according to claim 1, further comprising: removing the carrying board and disposing a functional layer on the chips.

5. The packaging method according to claim 4, wherein the functional layer is a heat dissipating layer.

6. The packaging method according to claim 1, wherein in the step of disposing the chips on the carrying surface of the carrying board, each of the chips is fixed to the carrying surface of the carrying board by an adhesive material.

7. A package structure, comprising:
a carrying board having a carrying surface;
a plurality of chips disposed on the carrying surface of the carrying board, wherein each of the chips includes a first side connected to the carrying surface and a second side opposite to the first side, and the second side is provided with at least one chip connecting member;
a base structure having a bonding surface provided with a plurality of predetermined regions for bonding the chips respectively, wherein each of the predetermined regions has at least one electrically connecting structure formed therein; and
an encapsulating layer located between the carrying board and the base structure to isolate the chips from the external environment;
wherein the at least one chip connecting member of each of the chips and the at least one electrically connecting structure in the corresponding one of the predetermined regions have a metal-to-metal bond formed therebetween, and the metal-to-metal bond and the encapsulating layer are both formed under hot pressing conditions.

8. The package structure according to claim 7, wherein the metal-to-metal bond is a copper-to-copper direct bond, a silver-to-silver direct bond, a gold-to-tin eutectic bond, a gold-to-silver eutectic bond, a palladium-to-tin eutectic bond, a palladium-to-silver eutectic bond, or a palladium-to-copper eutectic bond.

9. The package structure according to claim 7, wherein the second side of each of the chips is further provided with a plurality of contact pads and a redistribution structure formed on the contact pads, and the at least one chip connecting member is formed on the redistribution structure and in electrical contact with the contact pads.

10. The package structure according to claim 7, wherein the base structure is a circuit board, a lead frame, or a package substrate.

\* \* \* \* \*